United States Patent [19]
Gutierrez et al.

[11] Patent Number: 5,239,642
[45] Date of Patent: Aug. 24, 1993

[54] DATA PROCESSOR WITH SHARED CONTROL AND DRIVE CIRCUITRY FOR BOTH BREAKPOINT AND CONTENT ADDRESSABLE STORAGE DEVICES

[75] Inventors: Joseph A. Gutierrez, Austin; William C. Moyer, Dripping Springs; Yui K. Ho, Austin, all of Tex.

[73] Assignee: Motorola, Inc., Schaumburg, Ill.

[21] Appl. No.: 679,477

[22] Filed: Apr. 2, 1991

[51] Int. Cl.$^5$ .................... G06F 11/00; G06F 12/02; G11C 8/00
[52] U.S. Cl. .................... 395/425; 371/19; 365/49; 364/DIG. 1
[58] Field of Search .......... 364/DIG. 1; 395/425; 365/189.01, 49, 189.05; 371/19

[56] References Cited

U.S. PATENT DOCUMENTS

| | | | |
|---|---|---|---|
| 3,937,938 | 2/1976 | Matthews | 364/DIG. 1 |
| 4,635,193 | 1/1987 | Moyer et al. | 371/19 X |
| 4,675,646 | 6/1987 | Lauer | 364/DIG. 2 |
| 4,740,895 | 4/1988 | Sargent et al. | 364/DIG. 1 |
| 4,866,665 | 9/1989 | Haswell-Smith | 371/19 |
| 5,057,837 | 10/1991 | Colwell et al. | 364/DIG. 2 X |
| 5,134,701 | 7/1992 | Mueller et al. | 371/19 |
| 5,165,027 | 11/1992 | Krauskopf et al. | 395/400 |

FOREIGN PATENT DOCUMENTS 0507208 10/1992 European Pat. Off.

OTHER PUBLICATIONS

IEEE Software, vol. v5 No. 5 "Strong Debugger has Few Flaws" by Kapoor, B. Sep. 1988 p. 105.

Primary Examiner—Alyssa H. Bowler
Attorney, Agent, or Firm—Elizabeth A. Apperley

[57] ABSTRACT

A data processing system (10) implements a combined static and a dynamic masking operation of a breakpoint address. A static mask implements a conditional mask of a predetermined number of bits specified by the user and is determined prior to a comparison operation between the breakpoint address stored in a breakpoint register (24) and a logical address transferred via a logical address bus (11). A dynamic mask value implements a variable mask which allows the data processing system to mask the breakpoint address according to the size of a breakpoint address access. The static mask value and the dynamic mask value are combined using the same circuitry to form a combined mask value (19). Breakpoint function and address translation are implemented in the system (10) by using the same drive and control circuitry (20,44,48) to accomplish both functions. The breakpoint register (24) is implemented as an entry in a CAM array (26).

14 Claims, 3 Drawing Sheets

DATA PROCESSOR WITH SHARED CONTROL AND DRIVE CIRCUITRY FOR BOTH BREAKPOINT AND CONTENT ADDRESSABLE STORAGE DEVICES

CROSS REFERENCE TO RELATED APPLICATION

This application is related to a commonly assigned copending patent application filed simultaneously herewith and entitled:
1. "A DATA PROCESSOR WITH COMBINED STATIC AND DYNAMIC MASKING OF OPERAND INFORMATION" by Moyer et al., Ser. No. 07/679,478 and
2. "A DATA PROCESSOR WITH CONCURRENT INDEPENDENT STATIC AND DYNAMIC MASKING OF OPERAND INFORMATION" by Ho et al., Ser. No. 07/679,463.

FIELD OF THE INVENTION

This invention relates generally to data processors, and more particularly, to shared control and drive circuitry in a data processor.

BACKGROUND OF THE INVENTION

During development of a software program in a data processing system, numerous techniques are open implemented to analyze the functionality and efficiency of the software program. A commonly used technique inserts a breakpoint in the software program to signal the data processing system to interupt current execution of the software program at a predetermined point. In a data processing system, a value of a breakpoint is typically defined by the user and stored in a breakpoint register. The breakpoint register generally receives an address from an address bus and then compares the address with the contents of the breakpoint register. If the received breakpoint address of a corresponding breakpoint address range and the contents of the breakpoint register match, a signal is sent to a central processing unit in the data processing system and an exception processing routine specified by the user of the system is typically executed. For example, the user of the system may specify that the internal registers of the data processor be displayed every time a breakpoint signal is encountered.

Because many data processing systems have a breakpoint function integrated within the system, a significant amount of circuit area must be dedicated to this function. The added circuitry associated with the breakpoint function is typically complex and requires a large amount of circuit area. Generally, breakpoint values are stored in breakpoint registers through either hardware implementations external to the data processing system or circuitry integrated within the data processing system. A breakpoint function which is implemented with hardware external to the data processing system generally provides a response which is too slow for most applications. A breakpoint function which is implemented with internal logic circuitry provides a quicker response than the externally implemented breakpoint function, but adds a significant amount of logic circuitry to the data processing system. For example, both driver circuitry and decode logic must be implemented for each bit of the breakpoint register. If a single breakpoint register is thirty-two bits wide, the circuitry associated with the breakpoint function increases significantly if more than one breakpoint is implemented in the system. If the circuitry of a data processing system is too dense and complex, limitations due to a fixed circuit area might even preclude the breakpoint capability in the data processing system.

In many data processing systems designs, both area limitations and growing circuit complexities are primary concerns. Therefore, a system designer must often choose between the convenience of breakpoints during system evaluation and the limitations of a fixed circuit area.

SUMMARY OF THE INVENTION

The previously mentioned needs are fulfilled with the present invention. Accordingly, there is provided, in one form, a data processor which has shared control and drive circuitry for both breakpoint and content addressable storage functions. The system is comprised of a central processing unit which executes data processing instructions and provides both general addresses corresponding to a first plurality of storage locations of information and breakpoint addresses corresponding to a second plurality of storage locations of breakpoint data. The system is also comprised of a plurality of driver circuits. Each driver circuit is coupled to the central processing unit and selectively receives a predetermined bit of the general addresses and the breakpoint addresses. The driver circuits also provide a plurality of output signals which are coupled to a storage portion. The storage portion contains both the first and second plurality of storage locations respectively containing both general coincidence addresses and breakpoint coincidence addresses. The storage portion selectively provides either a general coincidence match signal which indicates that the general address was previously stored in the storage portion or a breakpoint enable signal which directs the central processing unit to be interrupted. The general coincidence match signal and the breakpoint enable signal are provided in response to the plurality of driver circuits.

These and other features, and advantages, will be more clearly understood from the following detailed description taken in conjunction with the accompanying drawings.

DETAILED DESCRIPTION OF A PREFERRED EMBODIMENT

In a data processing system, a content addressable memory (CAM) is a memory wherein a stored element is identified on the basis of data content rather than on storage address location. A CAM is typically formed of CAM cells arranged in rows and columns to form an array. In a traditional CAM array architecture, information is generally accessed simultaneously and in parallel to provide a data processing system which completes a large number of operations in a relatively short amount of time. The unique architecture of the CAM array has found applications in many data processing systems. For example, the parallel processing of the CAM array enables a significant amount of data from memory to be retrieved from a data processing system in less time than a conventional memory implementation. In more advanced applications in which the CAM array is used as an Address Translation Cache (ATC), the CAM array also enables the user to allocate, control, and access portions of a memory space in the data processing system.

As described herein, a CAM array is integrated with a logic circuit which executes a breakpoint operation. A breakpoint operation commonly signals a data processing system to interrupt current execution of a software program at a predetermined address in the program. The predetermined address is generally referred to as a breakpoint address. In a data processing system, a value of a breakpoint address is typically defined by the user and stored in a breakpoint register. If an address on an address bus and the breakpoint address or breakpoint address range stored in the breakpoint register match, a breakpoint signal is sent to a central processing unit in the data processing system to execute an exception processing routine associated with the breakpoint function. For example, the user of the system may specify that the exception processing routine display the internal registers of the data processor every time a breakpoint signal is encountered.

In some cases, the user of a system may use a masking operation to exclude certain bits from a comparison operation between the address on the address bus and the breakpoint address. A static mask is defined and implemented before the comparison operation occurs. A dynamic mask is defined and implemented at the same point in time that the comparison operation occurs. The invention described herein implements both static and dynamic masking operations during a breakpoint operation.

Figure 1:
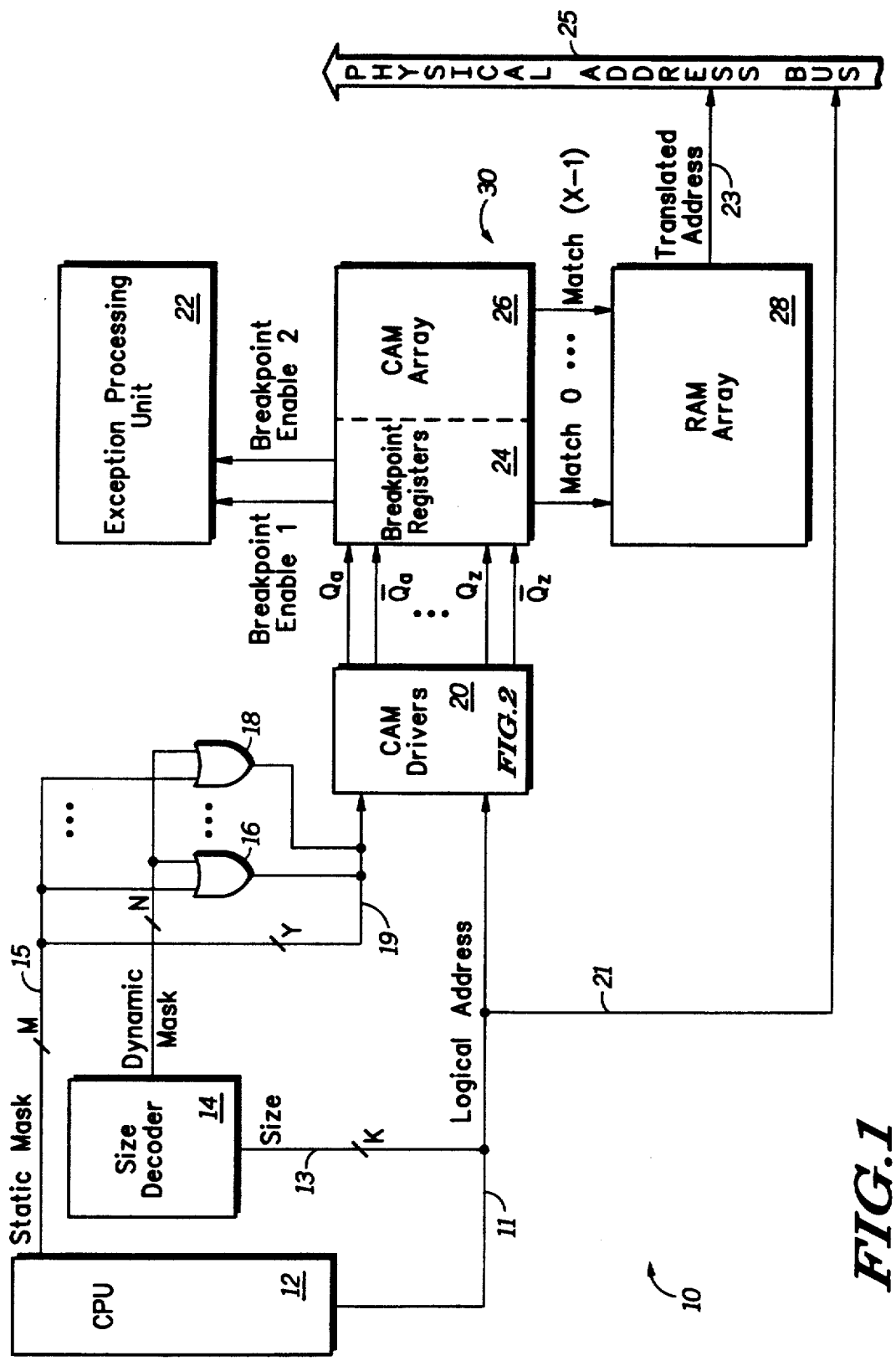
FIG. 1 illustrates in partial block diagram form a data processor having a content addressable storage device and a breakpoint function with shared control and drive circuitry in accordance with the present invention.

Illustrated in FIG. 1 is a block diagram of a data processing system 10 with shared control and drive circuitry for a content addressable storage device and a breakpoint device. The breakpoint device may be both statically and dynamically masked. The data processing system 10 generally comprises a central processing unit (CPU) 12, a size decoder 14, a plurality of OR gates 16 and 18, a plurality of content addressable memory (CAM) drivers 20, an exception processing unit 22, a plurality of breakpoint registers 24, a CAM array 26, and a random access memory (RAM) array 28. The CAM array 26 and the RAM array 28 are collectively referred to as an "Address Translation Cache"(ATC) 30.

The CPU 12 provides a plurality of input signals to the size decoder 14 via a Size bus 13. The Size bus 13 is K bits wide, where K is an integer. In the illustrated embodiment of the invention, the information transferred by the Size bus 13 is an encoded value of a dynamic mask which indicates the size of an access of either a breakpoint address value stored in the breakpoint registers 24 or an address value stored in the CAM array 26. Both address values are generally determined by the user of the data processing system 10 and may be accessed in a variety of sizes which include byte, half-word, word, double-word, and quad-word lengths.

An example of an implementation of a dynamic mask in a plurality of typical breakpoint registers is explained in the following example. The dynamic mask would be similarly implemented in CAM array 26. During operation of a data processing system, each address value transferred from CPU 12 by logical address bus 11 is compared with each one of the breakpoint address values stored in the plurality of breakpoint registers. Since each address value corresponds to a byte of information, a byte may be accessed at any address location. However, a half-word address access requires two bytes of information. The half-word address may only be accessed at hexadecimal address $0 and other hexadecimal addresses which are multiples of two, such as $2, $4, and $6. Likewise, a word address access requires four bytes of information. Similarly, a word address value may be accessed at hexadecimal address $0 and other hexadecimal addresses which are multiples of four, such as $4 and $8. Assume that the user of the data processing system 10 has stored a breakpoint address value $5 in one of the breakpoint registers. If a byte access is performed, a match between the breakpoint address value and the logical address may only be obtained if address $5 is accessed. If a half-word access is performed, a match is observed if address $4 is accessed. If address $5 is accessed, a match occurs, but boundaries of the addresses determine that the half-word access should begin at address $4, rather than providing a half-word access from address $5 to address $6. Likewise, if a word access is performed, a match is observed if one of address $4, address $5, address $6, or address $7 is accessed.

A plurality of N output signals of the size decoder 14 indicate which bits in a breakpoint address should be masked to implement the dynamic masking function described above. The size decoder 14 decodes the K input signals to the plurality of N output signals, where N is an integer. The N output signals may be manipulated by a plurality of OR gates, such as 16 and 18, during a masking operation. Each one of the plurality of N output signals of the size decoder 14 is connected to a first input of one of the plurality of OR gates 16 and 18 via a N bit wide bus labelled "Dynamic Mask".

An example of the decode operation implemented by the Size Decoder 14 is illustrated in the following table. Assume that K equals three and N equals four such that the size decoder 14 has three input signals and four output signals.

| Access Size | Size Signal | Dynamic Mask Signal |
| --- | --- | --- |
| Double Word | 000 | 0111 |
| Half Word | 001 | 0001 |
| Word | 010 | 0011 |
| Byte | 011 | 0000 |
| Quad | 1XX | 1111 |

Assume that the user of the data processing system 10 accesses a byte of an address value. The encoded Size signal has a binary value of 011 which translates to a binary dynamic mask value of 0000. Typically, a mask bit value of one prevents the corresponding address bit from participating in a comparison operation. In this case, no bits have a value of one in the dynamic mask value. Therefore, all bits of the breakpoint address stored in the breakpoint register are compared to the address on the address bus. Because each breakpoint register address stores a byte of information, all bits should be examined during a comparison operation. On the other hand, if the user of the system accessed a word of information, the Size signal would have a binary value of 010 and the corresponding Mask signal would have a binary value of 0011. In this example, the lower two bits have a value of one and are, therefore, effectively disabled from participating in the comparison process between the current address on the address bus and the breakpoint address. Because the lower two bits of the corresponding address are prevented from participating in the comparison operation, a word of the breakpoint address is effectively masked.

A static mask may also be implemented in the data processing system 10. As stated above, the static mask must be determined by the user of the data processing system prior to the access of the address stored in the breakpoint register. The value of the static mask is provided by the CPU 12 via the Static Mask bus 15 and is M bits wide, where M is an integer. In this embodiment of the invention, the static mask is identical for each row of information stored in the breakpoint registers 24 and the CAM array 20. A first predetermined portion of the static mask is N bits wide and is transferred to a second input of one of the plurality of OR gates 16 and 18 via the Static Mask bus 15. A second portion of the static mask is Y bits wide, where Y is an integer, and is transferred to a first plurality of input signals of the CAM drivers 20 via an Input Mask Bus 19. The Input Mask Bus 19 is (N+Y) bits wide and transfers an Input Mask signal.

A plurality of output signals from OR gates 16 and 18 form a combined static and dynamic mask signal which is also connected to the first plurality of input signals of the CAM drivers 20 by the Input Mask bus 19. The combined mask signal indicates which bits of the breakpoint address should be masked during a comparison operation between information stored in and information currently entered in either the breakpoint register 24 or the CAM array 26. By implementing a plurality of OR gates 16 and 18 to output a combined mask signal, the static and dynamic mask functions are combined to execute a masking operation. The execution of the two mask functions as a combined mask signal results in a more versatile masking operation which requires less execution time than a sequentially executed masking operation.

An address on the address bus is connected to a second plurality of input signals of the CAM drivers 20 by a Logical Address bus 11. The plurality of CAM drivers 20 serves as a buffer between an address on the Logical Address bus 11 and both the plurality of breakpoint registers 24 and the CAM array 26.

Figure 2:
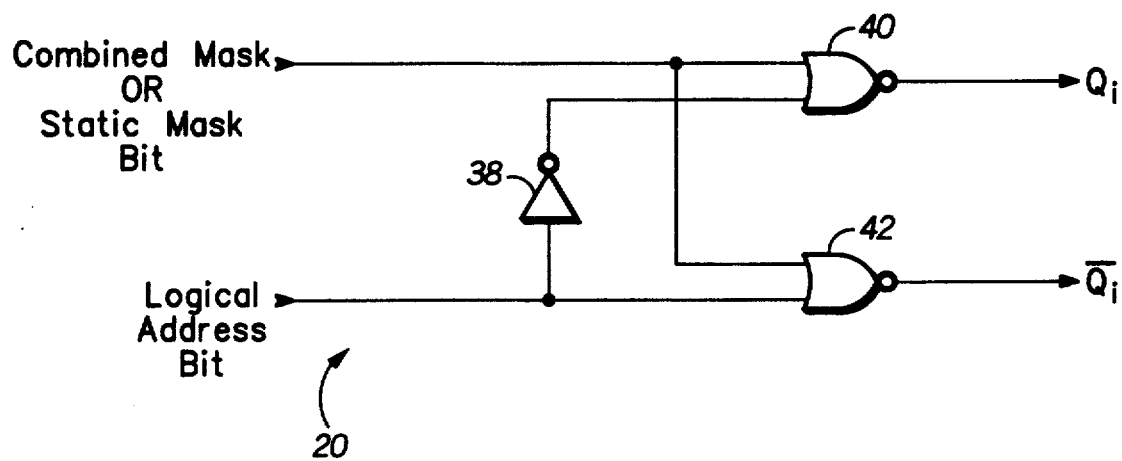
FIG. 2 illustrates in logic diagram form one of a plurality of CAM drivers as illustrated in FIG. 1.

FIG. 2 illustrates the logic circuitry of one of the plurality of CAM drivers 20. The CPU 12 provides an input signal labelled "Logical Address" to each one of the plurality of CAM drivers 20 via the Logical Address bus 11. The Logical Address signal is the value of one bit of the logical address value transferred via the Logical Address bus 11. The Logical Address signal provides an input to an inverter 38 and a first input to a NOR gate 42. The output of inverter 38 is connected to a first input of a NOR gate 40. Each Input Mask signal, transferred via the Input Mask Bus 19, provides a second input to NOR gate 40 and a second input to NOR gate 42. The Input Mask signal is comprised of either the combined mask signal output by the plurality of OR gates 16 and 18 or the second portion of the static mask. The value of the Input Mask signal is dependent on the respective one of the plurality of CAM drivers 20 which is accessed. For example, if the combined mask value affects four of the plurality of CAM drivers 20, the Input Mask Signal will reflect the combined mask value any point in time that a respective one of the four of the plurality of CAM drivers 20 is accessed. At all other times, the Input Mask signal will reflect the value of the second portion of the static mask signal.

An output of NOR gate 40 is signal labelled "Qi" and an output of NOR gate 42 is a signal labelled "$\overline{Qi}$". The Qi and the $\overline{Qi}$ signals provide input to both the breakpoint registers 24 and the CAM array 26. The Qi signal is one of A output signals of CAM drivers 20, where A is an integer.

A bit of the breakpoint registers 24 and a bit in the CAM array 26 are both implemented with logic comprising a standard CAM cell which may be masked. Information to be loaded and stored in the breakpoint registers 24 and the CAM array 26 is typically entered by a plurality of bit lines and inverse bit lines. The stored information may also be referred to as a coincidence value. In this embodiment, a Qi and $\overline{Qi}$ signal are referred to as a bit line signal and an inverse bits line signal, respectively. A control signal which enables a predetermined row of cells in the breakpoint registers 24 or the CAM array 26 is referred to as a word line signal (not shown in FIG. 1). When the word line signal is enabled, information is written to or read from a corresponding row of information. The data processor system typically determines which word line signal is enabled. The information is respectively either entered by or output to the Qi and the $\overline{Qi}$ signals.

When the Qi and $\overline{Qi}$ signals provide data to both the breakpoint registers 24 and the CAM array 26, a zero on both signals effectively prevent the information stored at a corresponding location in the breakpoint registers 24 or the CAM array 26 from participating in an operation specified by the user of a data processing system 10. A zero on both signals effectively masks the information of the corresponding location.

As illustrated in FIG. 2, when the Input Mask signal has a binary value of one, both the Qi and $\overline{Qi}$ signals have a value of zero. Therefore, if either the combined mask value or the second portion of the static mask value has one or more bits with a value of one, the address bits accessed by the corresponding Qi and the $\overline{Qi}$ signals can not participate in an associative match function specified by the user of the data processing system 10. If the Input Mask signal has a binary value of zero, the Qi and the $\overline{Qi}$ signals reflect the value of the respective bit of the logical address.

The breakpoint registers 24 and the CAM array 26 perform a compare function between current information driven to a predetermined row of the breakpoint registers 24 and the CAM array 26 by the bit line and inverse bit lines, and information previously stored in the predetermined rows. Due to the structure of the CAM array 26, the information driven to a predetermined row of the breakpoint registers of the CAM array 26 is simultaneously broadcast to all other rows.

For example, a breakpoint address stored in the breakpoint registers 24 is determined by the user of the data processing system 10 and generally indicates an address at which the user would like to suspend execution of a program. As a program is executed, logical address values are transferred via the Logical Address Bus 11. Due to the structure of data processing system 10, each one of the logical address values are compared with the contents of the breakpoint registers 24. If the logical address value matches the contents of any of the breakpoint registers 24, a breakpoint enable signal is asserted. In this example, two breakpoint values are stored in the breakpoint registers 24. Therefore, two possible breakpoint enable signals labelled "Breakpoint Enable 1" and "Breakpoint Enable 2" are respectively asserted. The Breakpoint Enable 1 signal and the Breakpoint Enable 2 signal are connected to an Exception Processing Unit 22. The exception Processing Unit 22 processes the Breakpoint Enable 1 signal and the Breakpoint Enable 2 signal as determined by the user of the data processing system 10.

In the CAM array 26, the current information being loaded by the bit line and the inverse bit line signals is generally referred to as the "TAG" word, and the information previously stored in the rows of cells in the CAM array 26 is referred to as the "stored" word. If the TAG word is identical to the stored word, the CAM array 26 provides a plurality of X output signals, where X is an integer, each of which indicates that a match has occurred. Each one of the plurality of X output signals is labelled "Match 0" through "Match (X-1)", respectively.

The Match 0 through Match (X-1) signals provide a plurality of input signals to the RAM array 28. Each one of the Match 0 through Match (X-1) signals enables a single corresponding cell in the RAM array 28. The RAM array 28 then provides a corresponding first portion of a physical address to a Physical Address Bus 25 via a Translated Address Bus 23. A second portion of the physical address is provided by transferring, without translation, a portion of the logical address of the Physical Address Bus 25 via a Lower Logical Address Bus 21. The two portions of the physical address are integrated to form an address signal which indicates the location of information within the data processing system 10. For example, assume that a Logical Address signal coupled from Logical Address Bus 11 to the CAM array 26 is identical to a stored word in the CAM array 26. Subsequently, a Match signal is asserted and a RAM array 28 locations is selected. The address stored at the selected RAM array 28 location is output to the Physical Address Bus 25 via the Translated Address Bus 23 and provides a high order portion of a physical address transferred via the Physical Address Bus 25. A low order portion of the physical address transferred via the Physical Address Bus 26 is identical to a predetermined low order portion of the logical address transferred via the Logical Address Bus 11.

Figure 3:
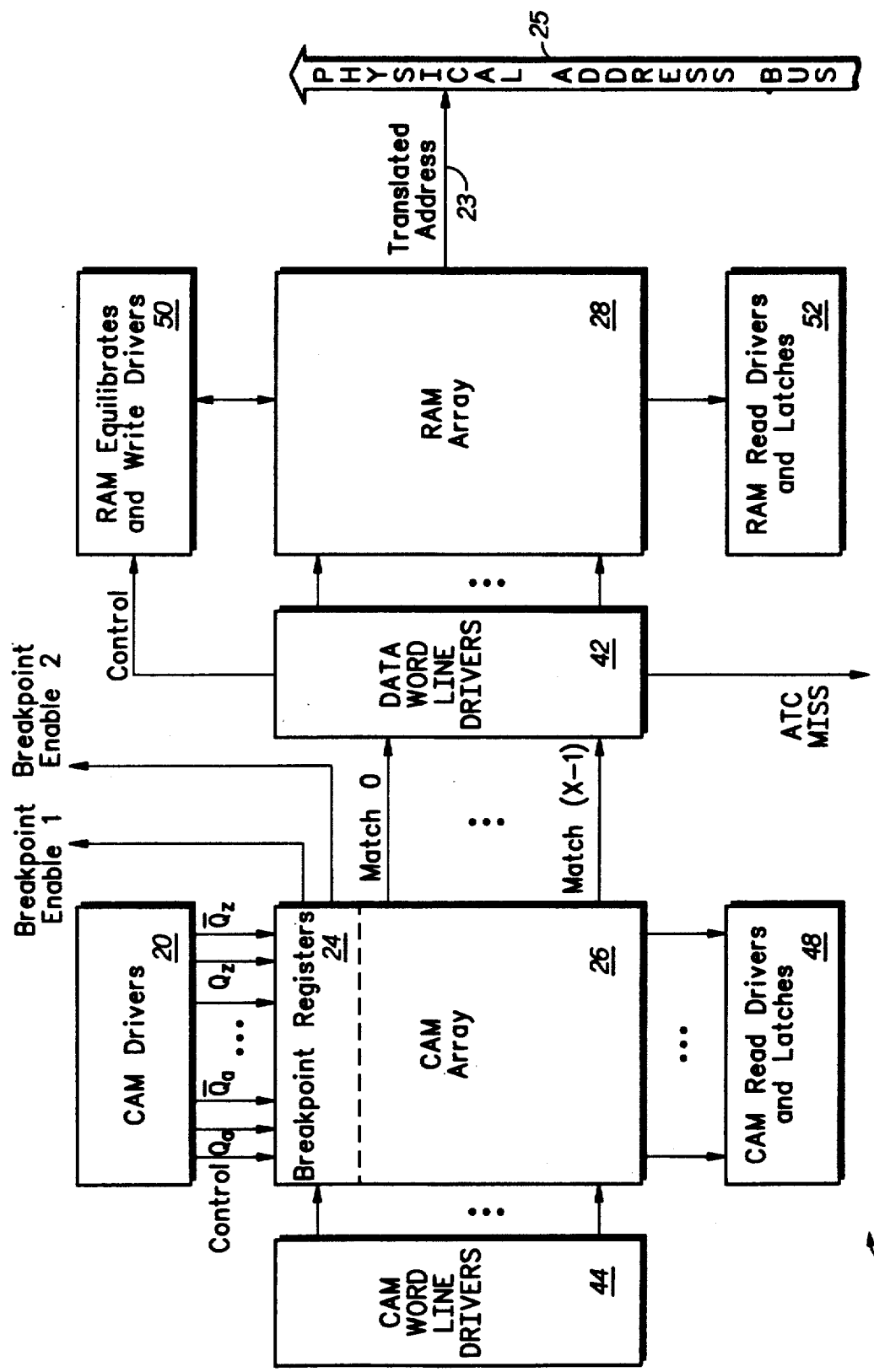
FIG. 3 illustrates in block diagram form an Address Translation Cache as illustrated in FIG. 1.

An ATC 30 is formed by the CAM array 26 and the RAM array 28. The ATC 30 is illustrated in greater detail in FIG. 3. A plurality of CAM Drivers 20 is connected to a first plurality of inputs to the breakpoint registers 24 and to the CAM array 26. The plurality of CAM Drivers 20 acts as a buffer and transfer information from the CPU 12 to the first plurality of inputs of either the breakpoint registers 24 or of the CAM array 26. The plurality of output signals from the plurality of CAM Drivers 20 are referred to as the Qi and the $\overline{Qi}$ signals as discussed previously. The plurality of CAM Drivers 20 also provides a first control signal to the breakpoint registers 24 and the CAM array 26. The first control signal executes a function specified by the user of the data processing system 10. A plurality of CAM Word Line Drivers 44 is coupled to a second control input of each row of the breakpoint registers 24 and to each row of the CAM array 26. The plurality of second control inputs, previously referred to as the word line signals, determines which row of the breakpoint registers 24 should be accessed during a read or write operation in a breakpoint operation and which row of the CAM array 26 should be accessed during a read or write operation in an address translation function. The CAM Read Drivers and Latch 48 are connected to a first plurality of output signals of both of the breakpoint registers 24 and the CAM array 26. The CAM Read Drivers and Latch 48 enable the bits of the breakpoint registers 24 and the cells of the CAM Array 26 such that the information stored at the cells may be read. The information is subsequently latched for future use as determined by the user of the data processing system 10.

As previously illustrated, the breakpoint registers 24 provides two outputs labelled "Breakpoint Enable 1" and "Breakpoint Enable 2". Each of the breakpoint enable signals indicates that one of the values stored in the contents of the breakpoint registers 24 is identical to an address transferred by the CAM Drivers 20 to the user of the data processing system 10. The CAM array 26 provides X output signals labelled "Match 0" through "Match (X-1)" to a plurality of Data Word Line Drivers 42. A respective one of the Match 0 through Match (X-1) signals is asserted when a single stored word in the CAM array is identical to an address transferred by the CAM Drivers 20. The asserted Match signal selects one of a plurality of address locations in the RAM array 28.

The plurality of X Match signals provides a plurality of input signals to a plurality of Data Word Line Drivers 42. The plurality of Data Word Line Drivers 42 is coupled to a plurality of first control signals of each row of the RAM array 28. The plurality of Data Word Line Drivers 42 serves as a buffer to select a predetermined row of information in the RAM array 28 and determines which row of the RAM array 28 should be asserted during an address translation function. It a predetermined row of information in the RAM array 28 is not selected, an output signal labelled "ATC Miss" is asserted. The ATC Miss signal indicates that a location in the RAM array 28 could not be selected in accordance with the address specified by the plurality of Match signals output by the CAM array 26. Subsequently, the ATC Miss signal is output to the data processing system 10 and indicates that an error occurred to the user of the system.

A plurality of RAM Equilibrates and Write Drivers 50 is connected to a first plurality of inputs to the RAM array 28. The plurality of RAM Equilibrates and Write Drivers 50 acts as a buffer and transfers information to first plurality of inputs of the RAM array 28. The plurality of RAM Equilibrates and Write Drivers 50 also provides a second control signal to the RAM array 28. The second control signal executes a function specified by the user of the data processing system 10. A plurality of RAM Read Drivers and Latches 52 are connected to a first plurality of output signals of the RAM array 28. The plurality of RAM Read Drivers and Latches 52 enable the cells of the RAM Array 28 such that the information stored at the cells may be read. The information is subsequently latched for future use as determined by the user of the data processing system 10.

It should be well understood that an apparatus which integrates the control and drive circuitry of a breakpoint device with a content addressable storage device enhances the efficient operation of a data processing system. A breakpoint device is advantageous to the user of a data processing system during testing of that system. Current breakpoint implementation typically require a large amount of added circuitry. Therefore, in data processing systems which have circuit area limitations, the breakpoint function is not able to be implemented. In the invention described herein, the breakpoint address values are stored in registers prior to the actual breakpoint function. Information is stored in a CAM array in a similar manner. Likewise, the address to which the contents of the breakpoint register are compared in the same address used during comparison operations in the CAM array. Because the functions implemented by both the breakpoint registers and the CAM array are similar, the breakpoint function is implemented using the same control and drive circuitry of a content addressable storage device already implemented in the data processing system without adding a large amount of circuitry. The integration of the breakpoint registers with the CAM array provides an efficient and inexpensive solution to the need for breakpoint operations in a data processing system.

Additionally, the combined execution of both static and dynamic masking operations during a breakpoint function also enhances the flexible and efficiency of a data processing system. The user of the system is able to mask predetermined bits of a breakpoint address both before the address is accessed during a comparison operation and as the address is accessed during a comparison operation. The simultaneous execution of both the static and dynamic masking operations results in a breakpoint operation in which bits of the address may be masked according to position and according to the varying size of the address access. In both cases, the mask of the breakpoint address is effectively and quickly manipulated ;by the user of the data processing system with the addition of a small amount of external circuitry.

By now it should be apparent that there has been provided a data processor with shared control and drive circuitry for both a breakpoint device which may be simultaneously statically and dynamically masked and a content addressable storage device. There are many additional configurations for implementing the inventions described above. For example, although the embodiment of the invention described herein implemented a single static mask value for all entries in the breakpoint register 24 and the CAM array 26, multiple static mask values may be used. As well, the Size Decoder 14 may have any number of input signals and any number of output signals. The dynamic mask value could also be derived from control signals or from information other than the size of an address access. Additionally, the static mask and the dynamic mask may be integrated using a wide variety of alternative logic functions. The plurality of OR gates 16 and 18 is provided by way of example only. The implementation of the plurality of CAM drivers 20 may also be accomplished in a different manner. The function implemented by the logic circuit illustrated in FIG. 2 could be executed using a circuit which accomplishes a similar function, but not necessarily identical to the illustrated logic circuit. The common breakpoint register bit and the CAM cell used in the integrated breakpoint registers 24 and the CAM array 26 could be implemented using any standard CAM cell configuration. For example, a CAM cell which uses only a single bit line and not an inverse bit line to provide data could be easily used in the integrated breakpoint and content addressable storage device. In some cases, different data paths for loading and reading the integrated breakpoint and content addressable storage device might be used. In another form, the breakpoint signals output by the breakpoint registers when a match occurs between the breakpoint address and a current logical address value on the Logical Address bus 11 might be combined to one general breakpoint signal.

While there have been described herein the principles of the invention, it is to be clearly understood to those skilled in the art that this description is made only by way of example and not as a limitation to the scope of the invention. Accordingly, it is intended, by the appended claims, to cover all modifications of the invention which fall within the true spirit and scope of the invention.

We claim:

1. A data processor having shared control and drive circuitry for both breakpoint and content addressable storage functions, comprising:
   a central processing unit for executing data processing instructions and providing general addresses corresponding to a second plurality of storage locations of breakpoint data;
   a plurality of driver circuits coupled to the central processing unit, each of the driver circuits selectively receiving a predetermined bit of the general addresses and the breakpoint addresses, and providing a plurality of output signals; and
   storage means coupled to the plurality of driver circuits, the storage means comprising the first and second plurality of storage locations respectively containing both general coincidence addresses and breakpoint coincidence addresses to selectively provide either a general coincidence match signal indicating that the general address was previously stored in the storage means or a breakpoint enable signal directing the central processing unit to perform a predetermined function, the general coincidence match signal and the breakpoint enable signal being provided in response to the same plurality of driver circuits.

2. The data processing system of claim 1 further comprising:
   second storage means coupled to the general coincidence match signal, the second storage means providing a general translated address corresponding to a general storage location within a system comprising the data processor in response to the general coincidence match signal.

3. The data processing system of claim 1 further comprising:
   an exception processing means coupled to the breakpoint enable signal, the exception processing means enabling a breakpoint function in said data processor.

4. The data processing system of claim 1 further comprising:
   address masking means coupled to the central processing unit, the address masking means providing a mask signal which is coupled to each of the plurality of driver circuits, each driver circuit providing an output signal in response to receipt of a predetermined bit of the mask signal and a predetermined bit of either the general address or the breakpoint address.

5. The data processing system of claim 1 wherein the storage means further comprising:
   a plurality of breakpoint registers for selectively receiving, storing, and providing breakpoint addresses in response to the plurality of driver circuits; and a content addressable memory (CAM) coupled to the breakpoint registers, for selectively receiving, storing, and providing the general coincidence addresses in response to the same plurality of driver circuits.

6. The data processing system of claim 5 wherein the breakpoint registers and content addressable memory form an array of rows and columns of storage devices, each of the storage devices being controlled by one of a plurality of control signals provided by the plurality of driver circuits.

7. The data processing system of claim 5 wherein the plurality of driver circuits further comprise:
- a plurality of CAM data drivers for providing general coincidence addresses and breakpoint coincidence addresses respectively to the content addressable memory and the breakpoint registers;
- a plurality of CAM row control drivers for providing control signals to both the content addressable memory and the plurality of breakpoint registers, the control signals controlling the receiving, storing and providing of addresses in the content addressable memory and the plurality of breakpoint registers; and
- a plurality of CAM read drives coupled to both the content addressable memory and the plurality of breakpoint registers, the CAM read drivers providing the general coincidence addresses and breakpoint coincidence addresses as buffered signals.

8. In a data processor, a method of sharing control and drive circuitry for both breakpoint and content addressable storage functions, comprising the steps of:
executing data processing instructions;
providing both a general address corresponding to one of a first plurality of storage locations of information and a breakpoint address corresponding to one of a second plurality of storage locations of breakpoint data;
using shared driver circuitry to receive both the general address and the breakpoint address to provide a plurality of output signals;
coupling a storage means which combines a content addressable storage device and a plurality of breakpoint storage means to the shared driver circuitry; and
using the storage means to receive, store, and provide both breakpoint coincidence addresses and general coincidence addresses in response to the plurality of output signals.

9. The method of sharing control and drive circuitry for both breakpoint and content addressable storage functions of claim 8, further comprising the steps of:
providing a match signal in response to a coincidence of a received address and a resident address previously stored in the storage means; and
providing a translated address corresponding to a storage location of information stored elsewhere in a data processing system comprising the data processor and in response to the match signal.

10. The method of sharing control and drive circuitry for both breakpoint and content addressable storage functions of claim 8, further comprising the step of:
providing a breakpoint enable signal from the storage means in response to a coincidence of a received address and a resident address previously stored in the storage means, the breakpoint enable signal enabling a breakpoint function in said data processor.

11. The method of sharing control and drive circuitry for both breakpoint and content addressable storage functions of claim 8, further comprising the step of:
providing masking circuitry which provides a mask signal which is coupled to the shared driver circuitry, the shared driver circuitry providing an output signal in response to receipt of a predetermined bit of the mask signal and a predetermined bit of either the general address or the breakpoint address.

12. A data processor having shared control and drive circuitry for both breakpoint and address translation functions, comprising:
- a central processing unit for executing data processing instructions and providing both general logical addresses corresponding to first storage locations of information and breakpoint logical addresses corresponding to second storage locations of breakpoint data;
- a plurality of driver circuits, each of the driver circuits selectively receiving a predetermined bit of one of the general logical addresses or one of the breakpoint logical addresses, and providing a plurality of output information signals;
- a first storage means coupled to the plurality of driver circuits for receiving the output information signals, the first storage means containing both breakpoint coincidence addresses and general coincidence addresses to selectively provide at least one of a breakpoint enable signal or a general coincidence match signal in response to the same plurality of driver circuits; and
- a second storage means coupled to the general coincidence match signal, the second storage means provides a general physical address corresponding to a storage location of information in response to the general coincidence match signal.

13. The data processing system of claim 12 further comprising:
an exception processing means coupled to the breakpoint enable signal, the exception processing means enabling a breakpoint function in said data processor.

14. The data processing system of claim 13 further comprising:
address masking means coupled to the central processing unit, the address masking means providing a mask signal which is coupled to each of the plurality of driver circuits, each driver circuit providing a predetermined output information signal in response to receipt of a predetermined bit of the mask signal and a predetermined bit of either the general address or the breakpoint address.

* * * * *